United States Patent
Schwartzbart

(10) Patent No.: US 12,287,351 B2
(45) Date of Patent: Apr. 29, 2025

(54) ACCELEROMETER WITH HALL EFFECT SENSOR

(71) Applicant: Blue Origin Manufacturing, LLC, Huntsville, AL (US)

(72) Inventor: Aaron Schwartzbart, Sylmar, CA (US)

(73) Assignee: Blue Origin Manufacturing, LLC, Huntsville, AL (US)

( * ) Notice: Subject to any disclaimer, the term of this patent is extended or adjusted under 35 U.S.C. 154(b) by 220 days.

(21) Appl. No.: 17/809,850

(22) Filed: Jun. 29, 2022

(65) Prior Publication Data

US 2024/0003934 A1    Jan. 4, 2024

(51) Int. Cl.
*G01P 15/105*    (2006.01)
*G01R 33/07*    (2006.01)

(52) U.S. Cl.
CPC .......... *G01P 15/105* (2013.01); *G01R 33/072* (2013.01)

(58) Field of Classification Search
CPC ...... G01P 15/105; G01D 5/145; G01D 5/147; G01D 5/142; G01B 7/00; H01L 29/82; H01H 1/0036; G01R 33/07; G01R 33/02; G01R 33/077; G01R 15/202; G01R 33/072

See application file for complete search history.

(56) References Cited

U.S. PATENT DOCUMENTS

| | | | |
|---|---|---|---|
| 4,825,697 | A | 5/1989 | Huber |
| 7,305,882 | B1 | 12/2007 | May |

(Continued)

FOREIGN PATENT DOCUMENTS

| | | | |
|---|---|---|---|
| GB | 872887 | A * | 8/1957 |
| JP | 2000-258449 | A | 9/2000 |
| JP | 2006317184 | A * | 11/2006 |

(Continued)

OTHER PUBLICATIONS

Description: Dytran by HBK, "Accelerometers", retrieved online, URL: https://www.hbkworld.com/web/dytran/global/en/products/accelerometers, retrieved on Aug. 13, 2024.

(Continued)

*Primary Examiner* — John Fitzgerald
*Assistant Examiner* — Truong D Phan
(74) *Attorney, Agent, or Firm* — Knobbe, Martens, Olson & Bear, LLP

(57) ABSTRACT

Accelerometer with Hall effect sensor. The accelerometer may have a rounded magnetic assembly with rounded flux concentrator, such as a C-shape or horseshoe. Opposing ends of the concentrator may each have a magnet and form a gap having a highly-concentrated, non-linear magnetic field. Opposing ends of the concentrator may have a reduced width, such as cone-shaped. A Hall sensor may be located within or near the gap. The sensor or magnet may be moveably supported by a spring. The sensor may move perpendicularly relative to a direction of the magnetic field lines. A second magnet may be included, for example adjacent the gap, to provide a second set of magnetic field lines with shallower gradient for lower sensitivity. Movement of the sensor within the two magnetic fields may provide multiple wide-ranging sensitivities, such as "X" V/g as well as X/500 mV/g or X/5,000 mV/g.

20 Claims, 6 Drawing Sheets

(56) References Cited

U.S. PATENT DOCUMENTS 9,018,944 B2     4/2015  Mol
2003/0048100 A1*  3/2003  Genot .................. G01D 5/145
                                                         324/207.2

FOREIGN PATENT DOCUMENTS

| JP | 5429013 B2 * | 2/2014 |
| PL | 45431 B | 12/1961 |
| SU | 34458 A | 2/1934 |
| SU | 183416 A1 | 8/1966 |

OTHER PUBLICATIONS

Description: Dytran by HBK, "Voltage (IEPE/CCLD)", retrieved online, URL: https://www.hbkworld.com/web/dytran/global/en/products/accelerometers/voltage--iepe-ccld-, retrieved on Aug. 13, 2024.

Description: Dytran by HBK, "Viable Capacitance (VC) MEMS", retrieved online, URL: https://www.hbkworld.com/web/dytran/global/en/products/accelerometers/variable-capacitance--vc--mems, retrieved on Aug. 13, 2024.

Description: Dytran by HBK, "Charge", retrieved online, URL: https://www.hbkworld.com/web/dytran/global/en/products/accelerometers/charge, retrieved on Aug. 13, 2024.

Description: Dytran by HBK, "Cables", retrieved online, URL: https://www.hbkworld.com/web/dytran/global/en/products/accelerometers/cables/cables, retrieved on Aug. 13, 2024.

* cited by examiner

ACCELEROMETER WITH HALL EFFECT SENSOR

BACKGROUND

Field

This disclosure relates to accelerometers, in particular to accelerometers using Hall effect sensors.

Description of the Related Art

Accelerometers may use Hall effect sensors to measure accelerations. Movement of the sensors within a magnetic field generates electrical responses that may be measured to determine acceleration. Existing Hall-based accelerometers are complex and/or lack sufficient sensitivity. There is therefore a need for improvements to these and other drawbacks of existing Hall-based accelerometers.

SUMMARY

The embodiments disclosed herein each have several aspects no single one of which is solely responsible for the disclosure's desirable attributes. Without limiting the scope of this disclosure, its more prominent features will now be briefly discussed. After considering this discussion, and particularly after reading the section entitled "Detailed Description," one will understand how the features of the embodiments described herein provide advantages over existing approaches to accelerometers.

An accelerometer with a Hall effect sensor is described herein. The accelerometer may have a rounded magnetic assembly with a rounded flux concentrator, such as a C-shape or oval concentrator. Opposing ends of the concentrator may each include a magnet and form a gap having a highly-concentrated magnetic field. The magnetic field may be non-linear. The opposing concentrator ends may have a reduced width, such as cone-shaped. The Hall sensor may be located within the magnetic field, such as within or near the gap. The sensor or magnetic assembly may be moveably supported by a spring. The sensor and magnetic field lines may have relative movement in response to accelerations, such that the sensor moves perpendicular to the magnetic field lines. The non-linear, highly concentrated magnetic field may allow for highly sensitive measurements, such as 5 V/g. For example, the Hall element may see greater than 1,000 Oerstad (Oe) to seeing 0 (zero) Oe within just a few thousandths of an inch. In some embodiments, a second magnet may be included, for example located adjacent the gap, to provide multiple sensitivities, such as 5 V/g and 5 mV/g or 10 mV/g, in a single accelerometer and without needing additional electronics.

In one aspect, an accelerometer comprises a rounded first magnetic assembly and a Hall sensor. The rounded first magnetic assembly comprises a first concentrator extending from a first end having a first magnet to an opposing second end having a second magnet and forming a first gap between the first and second ends. The first magnetic assembly has a reduced width at each of the first and second ends and produces a non-linear first magnetic field between the first and second ends. The Hall sensor is at least partially located within a first portion of the first magnetic field having first magnetic field lines extending in a first direction, where the Hall sensor or first magnetic assembly is configured to move to cause relative displacement of the Hall sensor perpendicular to the first direction.

There are various embodiments of the above and other aspects. The accelerometer may further comprise a spring moveably supporting the Hall sensor, and where the first magnetic assembly is stationary, such that the Hall sensor is configured to move relative to the stationary first magnetic assembly. The accelerometer may further comprise a spring moveably supporting the first magnetic assembly, and where the Hall sensor is stationary, such that the first magnetic assembly is configured to move relative to the stationary Hall sensor. The first and second ends of the first magnetic assembly may be cone-shaped. The first concentrator may be C-shaped. The first concentrator may extend along an annular direction, the first magnetic field lines may be within the first portion of the first magnetic field extend in the annular direction in the first gap, and the Hall sensor may be moveably supported and configured to move in a direction perpendicular to the annular direction in the first gap. The accelerometer may further comprise an "X" VDC supply electrically connected to the Hall sensor, and where a sensitivity of the accelerometer is at least X V/g. The Hall sensor may experience a change in flux of at least 1000 Oersted in response to relative movement between the Hall sensor and the first magnetic assembly of no more than 0.005 inches. An initial position of the Hall sensor may be located in the first gap between the first and second ends. The accelerometer may further comprise a body encasing the first magnetic assembly and the Hall sensor, with the body configured to be attached to a cryogenic rocket.

The accelerometer may further comprise a rounded second magnetic assembly adjacent the first magnetic assembly, the second magnetic assembly comprising a second concentrator extending from a third end having a third magnet to an opposing fourth end having a fourth magnet and forming a second gap between the third and fourth ends, the second gap adjacent to the first gap, the second magnetic assembly having a reduced width at each of the third and fourth ends producing a non-linear second magnetic field between the third and fourth ends, and where the second magnetic assembly is oppositely magnetized relative to the first magnetic assembly, where the Hall sensor is at least partially located within a second portion of the second magnetic field having second magnetic field lines extending in a second direction that is opposite the first direction, and where the Hall sensor or second magnetic assembly is configured to move to cause relative displacement of the Hall sensor perpendicular to the second direction. The accelerometer may further comprise a spring moveably supporting the Hall sensor, and where the first and second magnetic assemblies are stationary, such that the Hall sensor is configured to move relative to the stationary first and second magnetic assemblies. The accelerometer may further comprise a spring moveably supporting the first and second magnetic assemblies, and where the Hall sensor is stationary, such that the first and second magnets are configured to move as a unit relative to the stationary Hall sensor. The first, second, third, and fourth ends may be cone-shaped. The first, second, third, and fourth ends may point towards each other. The Hall sensor may experience a change in flux of at least 1000 Oersted in response to relative movement between the Hall sensor and the first and second magnetic assemblies of no more than 0.005 inches. The accelerometer may further comprise a third magnet located adjacent the first gap and producing a second magnetic field. Second magnetic field lines of the second magnetic field may extend within the first portion of the first magnetic field in a second direction that is perpendicular to the first direction. The Hall sensor may be moveably supported by a spring, and the first magnetic assembly and the second magnet may be stationary. The accelerometer may further comprise a VDC supply electrically connected to the Hall sensor, and where a first sensitivity as the Hall sensor moves relative to the first magnetic field is X V/g, and a second sensitivity as the Hall sensor moves relative to a portion of the second magnetic field located outside the first magnetic field is at least X/500 V/g.

In another aspect, an accelerometer comprises a rounded first magnetic assembly and a permeable bridge. The rounded first magnetic assembly comprises a first concentrator extending from a first end having a first magnet to an opposing second end having a second magnet and forming a first gap between the first and second ends, the first magnetic assembly having a reduced width at each of the first and second ends and producing a non-linear first magnetic field between the first and second ends. The permeable bridge is in electrical communication with a Hall sensor, the permeable bridge at least partially located within a first portion of the first magnetic field having first magnetic field lines extending in a first direction, where the permeable bridge or the first magnetic assembly is configured to move to cause relative displacement of the permeable bridge perpendicular to the first direction.

There are various embodiments of the above and other aspects. The accelerometer may further comprise a spring moveably supporting the permeable bridge, and where the first magnetic assembly is stationary, such that the permeable bridge is configured to move relative to the stationary first magnetic assembly. The accelerometer may further comprise a spring moveably supporting the first magnetic assembly, and where the permeable bridge is stationary, such that the first magnetic assembly is configured to move relative to the stationary permeable bridge. The Hall Sensor may be stationary. The permeable bridge may comprise an elongate ferromagnetic material. The first and second ends of the first magnetic assembly may be cone-shaped. The first concentrator may be C-shaped.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are not to be considered limiting of its scope, the disclosure will be described with additional specificity and detail through use of the accompanying drawings. In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

DETAILED DESCRIPTION

Figure 1:
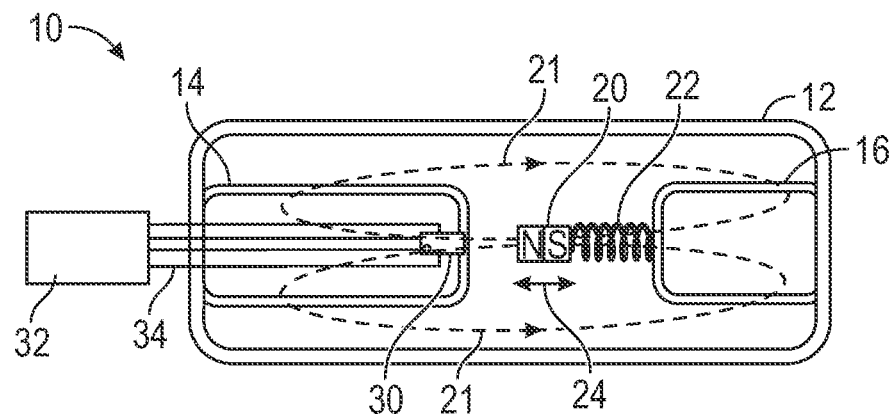
FIG. 1 is a schematic of an embodiment of a Hall-based accelerometer having a stationary a Hall sensor and magnet moveably supported on a spring.

The following detailed description is directed to certain specific embodiments of the development. Reference in this specification to "one embodiment," "an embodiment," or "in some embodiments" means that a particular feature, structure, or characteristic described in connection with the embodiment is included in at least one embodiment of the present disclosure. The appearances of the phrases "one embodiment," "an embodiment," or "in some embodiments" in various places in the specification are not necessarily all referring to the same embodiment, nor are separate or alternative embodiments necessarily mutually exclusive of other embodiments. Moreover, various features are described which may be exhibited by some embodiments and not by others.

Various embodiments will now be described with reference to the accompanying figures, wherein like numerals refer to like elements throughout. The terminology used in the description presented herein is not intended to be interpreted in any limited or restrictive manner, simply because it is being utilized in conjunction with a detailed description of certain specific embodiments of the development. Furthermore, embodiments of the development may include several novel features, no single one of which is solely responsible for its desirable attributes, or which is essential to practicing the present disclosure.

The Hall-based accelerometers according to the present disclosure provide solutions to problems with existing accelerometers and various advantages over existing devices. For example, for multiple sensitivity levels, conventional accelerometers typically require using two or more accelerometers per location that are set on two different sensitivities, which comes at a cost of accelerometer and cable weight, channel count, more opportunities for cable problems, complexity in design, etc. As further example, in cryogenic applications such as cryogenic rockets, difficult design constraints are imposed by trying to use electronics in or near the cryogenic accelerometer where the electronics lack cryogenic compatibility. As further example, conventional solutions impose complexity and require more labor hours for significant attention to detail regarding tribological issues with cables.

In contrast, the Hall-based accelerometer of the present disclosure solves the above and other problems and also provides various advantages over existing solutions. For example, one or more embodiments of the Hall-based accelerometer of the present disclosure solves or mitigates one or more the following: noise issues traditionally associated with piezo-based accelerometers in cryogenic rocket applications; issues involving electronics in or near the accelerometer which is at cryogenic temperatures; and the need for multiple accelerometers for cryogenic rocket applications to give high fidelity vibration data at lower vibration levels without saturating at higher vibration levels. In some embodiments of the accelerometer described herein, a single accelerometer with non-linear magnetic field gradient simultaneously provides 1) ultra-high sensitivity for high fidelity at low amplitudes and 2) low sensitivity for high amplitudes.

Further advantages of one or more of the embodiments of the Hall-based accelerometers described herein over piezo devices include the ability to measure a constant acceleration. For example, the Hall-based accelerometers described herein may measure acceleration in the frequency range of direct current (DC) to some upper limit, whereas the piezo device is limited in frequency range to a range from a few Hertz (Hz) to some upper limit. Thus, while piezo devices may have a limitation on the low end, the Hall-based accelerometers herein do not have such limitation and may allow for accessing DC on the low end. The Hall-based accelerometers herein may thus allow for benefiting from the DC capability of Hall sensors versus piezo crystals.

Some additional advantages of one or more of the embodiments of the Hall-based accelerometers described herein include ultra-high sensitivity when needed, with low sensitivity when needed, and without requiring any electronics in or near the cryogenic accelerometer. Further, the capability for ultra-high sensitivity without requiring electronics in or near the cryogenic accelerometer implies commensurately higher signal-to-noise and/or complete neutralization/elimination of traditional sources of noise, such as tribological noise.

Various applications besides the cryogenic rocket application may benefit from the Hall-based accelerometer described herein. For example, the ability to have a single, simple accelerometer with ultra-high sensitivity, or an accelerometer with ultra-high sensitivity and low sensitivity existing simultaneously without requiring electronics in or near the accelerometer, and the other embodiments described herein, could greatly benefit vibration measurement for automotive applications, aircraft applications, and civil-engineering or seismography applications associated with bridges, buildings etc., even where cryogenic considerations are not involved.

I. Hall-Based Embodiment

FIG. 1 is a schematic of an embodiment of a Hall-based accelerometer 10 having a stationary Hall sensor 30 and a magnet 20 moveably supported on a spring 22. The accelerometer 10 is encased in a body 12, which may be a cover or housing. The accelerometer 10, such as the body 12, may be attached to a vehicle or machinery. The spring 22 may be supported by a support 16 inside the body 12. A first end of the spring 22 attaches to the support 16 and a second end of the spring 22 is attached to the magnet 20. The magnet produces a magnetic field having magnetic lines 21. The magnetic lines 21 in FIG. 1, and the magnetic lines generally in other figures, are shown extending in a direction from the north pole "N" to the south pole "S". This is merely for illustration of the magnetic field, and is not limiting on the scope of the disclosure.

The Hall sensor 30 is stationary and supported by a support 14. The Hall sensor 30 is located within the magnetic field lines 21. A voltage supply 32 is electrically connected to the Hall sensor 30 via electrical lines 34. The Hall sensor 30 responds to a change in the magnetic field by altering a current or voltage. As the magnet 20 moves in response to experiencing accelerations, such as accelerations of the body 12 and/or the vehicle or machinery to which the body 12 is attached, the magnetic flux experienced by the stationary Hall sensor 30 changes. The changing magnetic flux in turn produces an electrical response, such as a change in voltage or current coming from the Hall sensor, that can be detected and analyzed to determine the amount and direction of acceleration. In this manner, relative displacement between the Hall sensor 30 and the field generated by the magnet 20 can be used to determine the acceleration. In some embodiments, the magnet 20 may be stationary and the Hall sensor 30 may be moveably supported by the spring 22, and a similar analysis of the relative displacement may be applied to determine acceleration.

The above example accelerometer 10 may include features that are included in any of the non-linear Hall-based accelerometers described herein, such as those of FIGS. 2A-6, except as otherwise noted.

II. Rounded Magnet Embodiments

Figure 2A:
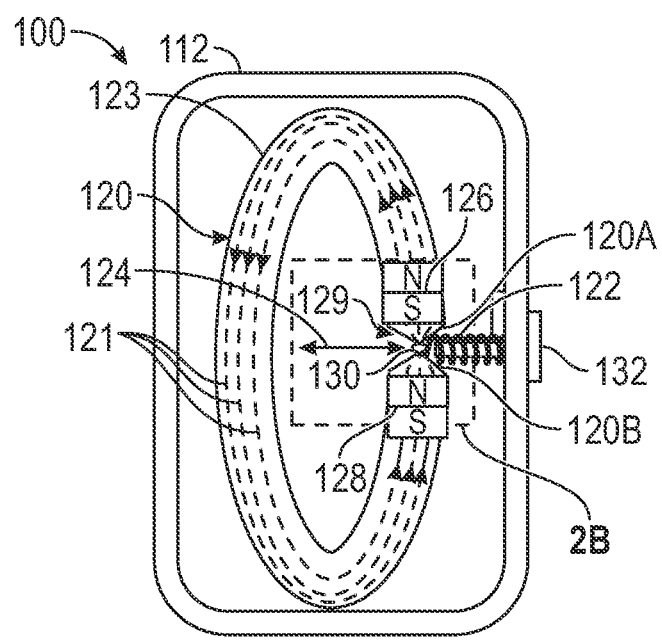
FIGS. 2A and 2B are schematic and closeup views, respectively, of an embodiment of a unipolar Hall-based accelerometer having a Hall sensor and a rounded magnetic assembly producing non-linear flux.
Figure 2B:
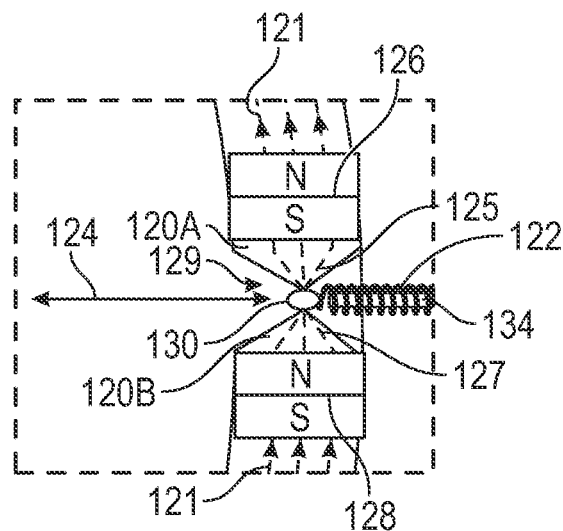

FIGS. 2A and 2B are schematic and closeup views, respectively, of an embodiment of a unipolar Hall-based accelerometer 100. The accelerometer 100 includes a Hall sensor 130 and a rounded magnetic assembly 120 producing a non-linear flux. The accelerometer 100 may include any of the features of the accelerometer 10, and vice versa, except as otherwise described. The Hall sensor 130 may move in a direction 124 through a magnetic field produced by the magnetic assembly 120 to detect acceleration, as further described.

The accelerometer 100 includes a body 112, which may be similar to the body 12. The body 112 may be a housing for the device and may attach to a vehicle or machinery, such as a cryogenic rocket. The body 112 may be metal, plastic, other suitable materials, or combinations thereof. The body 112 may support and/or encase the magnetic assembly 120 and Hall sensor 130. The body 112 may stationarily or moveably support the magnetic assembly 120 and/or Hall sensor 130. In the embodiment shown, the magnetic assembly 120 is stationary and the Hall sensor 130 is moveably supported. In some embodiments, the Hall sensor 130 may be stationary and the magnetic assembly 120 may be moveably supported.

The rounded magnetic assembly 120 includes a flux concentrator 123. The concentrator 123 may be a flux intensifier, diverter, or controller. The concentrator 123 may guide and/or intensify a magnetic field extending through the concentrator 123. The concentrator 123 may prevent the magnetic field from spreading around outside of the concentrator and/or intersecting with any electrically conductive surroundings. The concentrator 123 may include a tubular body, which may be solid. In some embodiments, the concentrator 123 may include a sidewall forming an internal, hollow channel therethrough. The concentrator 123 may have a circular or other rounded cross-sectional profile shape. The concentrator 123 may be formed of a high-permeability and low-power-loss material. The concentrator

123 may be formed of a ferrous or ferromagnetic material such as steel, a non-ferrous ferromagnetic material such as Nickel and Cobalt, other suitable materials, or combinations thereof. The concentrator 123 may be formed of a soft magnetic alloy, for example 48% NiFe, 80% NiFe, SiFe.

The rounded magnetic assembly 120, for example the concentrator 123, may extend from a first end 120A to a second end 120B. The ends 120A, 120B may be opposing ends of the concentrator 123. The ends 120A, 120B may be spaced apart from each other to form a gap 129 therebetween. The gap 129 may be a space defined at least partially by the ends 120A, 120B. The gap 129 may include the space directly between the two ends 120A, 120B. The gap 129 may include regions adjacent to the space directly between the two ends 120A, 120B. The gap 129 may have various shapes, depending on the shape of the two ends 120A, 120B. The gap 129 may have an hourglass shape, for example where the ends 120A, 120B are conical. The gap 129 may include a concentrated, non-linear magnetic field detected by a Hall sensor, as further described.

The rounded magnetic assembly 120 or portions thereof, for example the concentrator 123, may extend from the first end 120A to the second end 120B along a rounded path as shown. "Rounded" as used herein has its usual and customary meaning and includes, without limitation, circular, C-shaped, U-shaped, horseshoe-shaped, oval, elliptical, annular, circumferential, other rounded shapes, or combinations thereof. The shape may be any path that extends from a starting point such as the first end 120A and ends up meeting at another point, such as the second end 120B, that is across from or near that starting point, to produce the non-linear magnetic field between the two ends.

The rounded magnetic assembly 120 may include a first magnet 126 at or near the first end 120A, and a second magnet 128 at or near the second end 120B. The first and second magnets 126, 128 may each include north "N" and south "S" poles as indicated. The poles of each magnet 126, 128 may be oriented similarly, such that the magnetic field lines 121 extend in the same direction. As shown, the first magnet 126 has the north pole facing away from the second end 120B, and the south pole facing toward the second end 120B, and the second magnet 128 has the north pole facing toward the first end 120A and the south pole facing away from the first end 120A. Thus the field lines 121 extend counterclockwise as oriented in the figure, as shown by the arrow heads along the lines 121. The first and second magnets 126, 128 may be flipped or have their polarity reversed, such that the magnetic field lines 121 extend clockwise as oriented.

The first and/or second magnet 126, 128 may be rectangular as shown. The first and/or second magnets 126, 128 may be square, rounded, circular, cylindrical, conical, frustoconical, other suitable shapes, or combinations thereof. In some embodiments, the first and/or second magnets 126, 128 may have the same or similar shape as the reduced-width ends of the concentrator 123, such as cone-shaped, etc., as described.

The magnetic field lines 121 produced by the first and/or second magnets 126, 128 that extend respectively in the direction of the concentrator 123 may be intensified and guided by the concentrator 123 along the rounded path. Thus the magnetic field lines 121 may extend along a C-shape, etc. By concentrating the magnetic flux in the magnetic concentrator, the magnetic flux in the gap 129 between the magnets 126 and 128 will be commensurately more concentrated. This increased flux concentration in the gap 126 between magnets 126 and 128 will create a steeper field gradient, or in other words a more non-linear field in the gap 126 when traversed in the direction perpendicular to the field lines 125, 127. This greater concentration in the gap and attendant non-linear field when traversed perpendicularly may be accentuated by conical or frustoconical concentrators protruding from magnets 126 and 128 into the gap 129 between magnets 126 and 128.

The ends 120A, 120B may reduce in width in a respective direction away from the body of the concentrator 123, for example in directions toward the gap 129. The ends 120A, 120B may come to a point. The ends 120A, 120B may be the same shape, or they may each be different shapes. The ends 120A, 120B may be conical or cone-shaped, frustoconical, or pyramidal. The ends 120A, 120B may be separable concentrators made of the same material as concentrator 123, or the magnets 126 and 128 themselves may be formed with conical or frustoconical ends facing into the gap 129.

The two ends 120A, 120B may be opposing each other and be located on either side of the gap 129 defined between the two opposing ends 120A, 120B. A closeup of the gap 129 and nearby parts are shown in FIG. 2B. The rounded magnetic assembly 120, for example the fields of the first and second magnets 126, 128 as amplified by the concentrator 123, may produce a non-linear magnetic field or flux in and/or near the gap 129. The first magnet 126 at the first end 120A may produce magnetic field lines 125 extending toward the second magnet 128 (downward as oriented in the figure). The second magnet 128 at the second end 120B may produce magnetic field lines 127 extending toward the first magnet 126 (upward as oriented in the figure). Due to the reduced-width shape of the two ends 120A, 120B, the magnetic field lines 125, 127 may converge in the direction of the gap 129. In the gap 129, the magnetic field lines 125, 127 may thus be concentrated to produce a non-linear flux, such that very small displacements in directions perpendicular to the direction of the field lines within the gap 129 will result in very large changes in experienced flux.

Figure 4A:
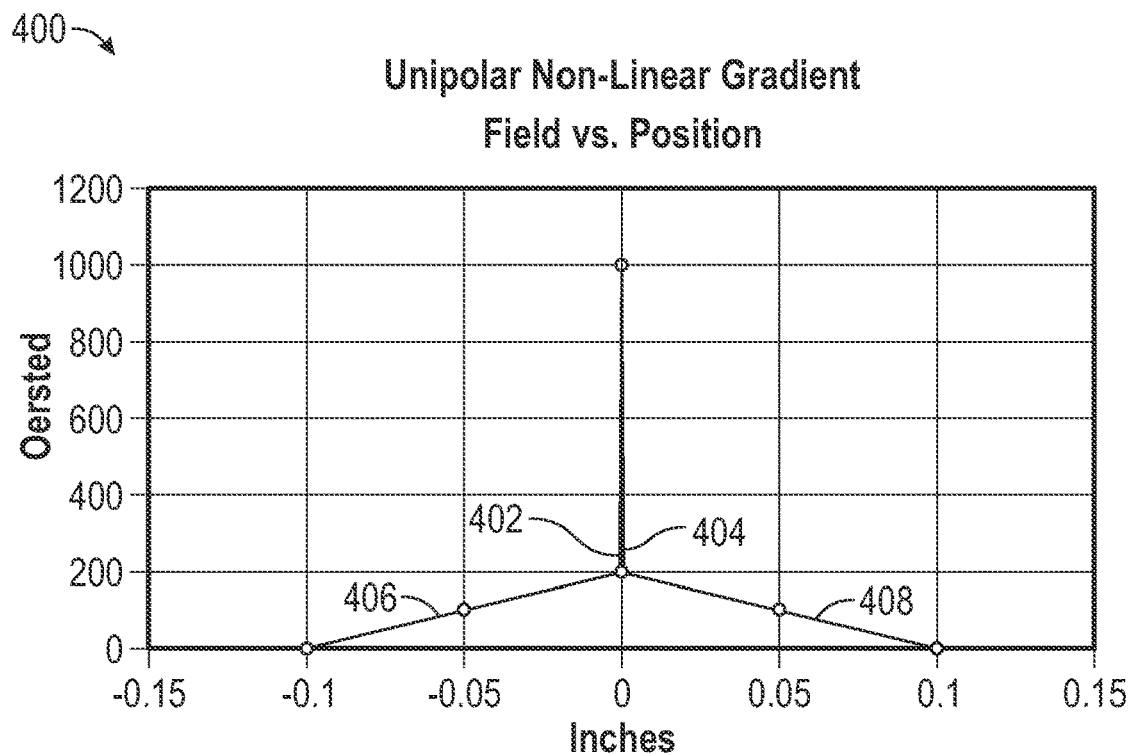
FIGS. 4A and 4B are data plots showing example non-linear relationships of displacement versus magnetic flux for, respectively, unipolar and bipolar Hall-based accelerometers according to some embodiments.
Figure 4B:
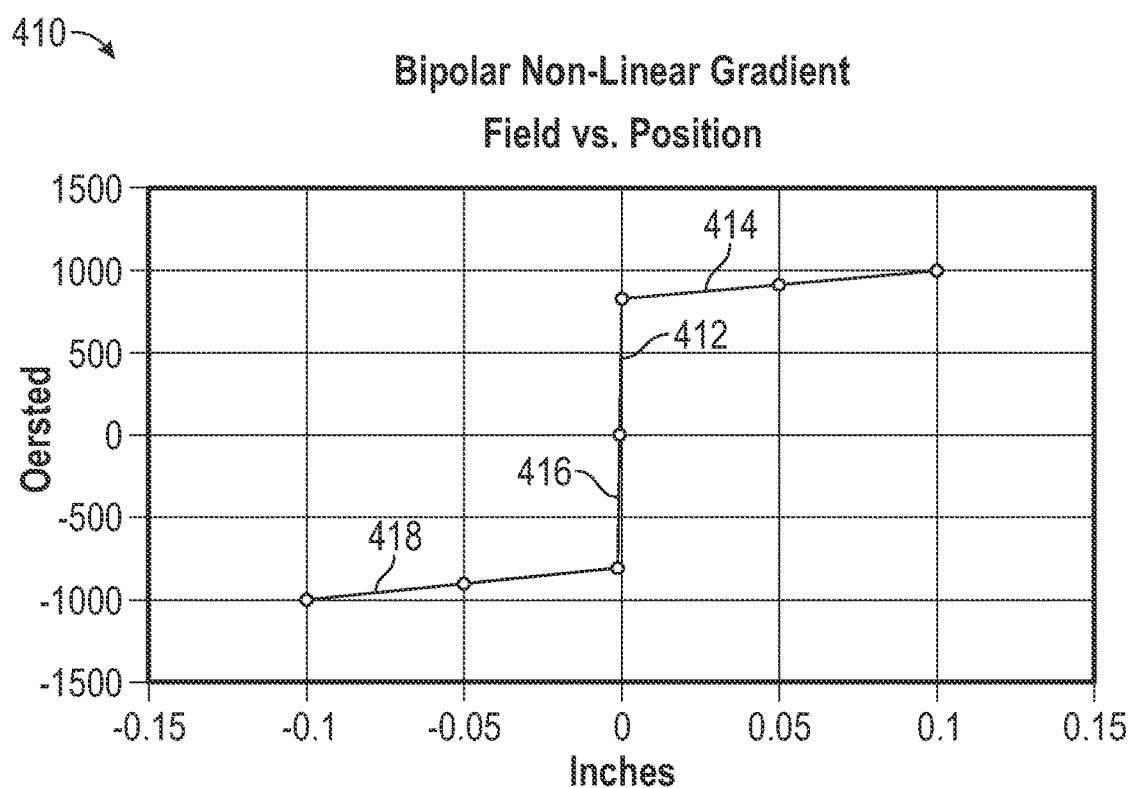

"Non-linear" as used herein as its usual and customary meaning, and includes without limitation a relationship between the strength of the magnetic field and the location within that field that is designated by or involves an equation whose terms are not of the first degree. Such non-linear relationship may include the strength of the field not being directly proportional to the location within that field, such that the field strength vs. location within that field may not be a single straight line when plotted on a graph. For example, in the gap 129, the relationship between 1) the experienced magnetic flux or field strength vs. 2) the relative displacement of the Hall sensor 130 and that field, may not be directly proportional. In some embodiments, the relationship may be parabolic, exponential, have multiple linear segments within the field, other non-linear relationships, or combinations thereof. Example embodiments of non-linear relationships are shown in FIGS. 4A and 4B. The plots of flux vs. position are nonlinear as the flux is traversed by the Hall sensor (or vice versa) in a direction that is perpendicular to that of the flux, as described herein.

The Hall sensor 130 may be a Hall effect sensor (or simply Hall sensor) that detects the presence and magnitude of a magnetic field using the Hall Effect. The Hall Effect is where a voltage is generated in a current-carrying conductor, in response to placing that conductor into a magnetic field. The generated voltage may be perpendicular to both the current and the field. The output voltage of the Hall sensor 130 may be directly proportional to the strength of the magnetic field being experienced at a given location. The Hall sensor 130 may be any type of suitable Hall sensor, such as that shown in FIG. 6.

The Hall sensor 130 is moveably supported by a spring 122. The spring 122 may be a coil spring or other resilient member. The spring 122 may be a compression or extension spring. The spring 122 may be any type of biasing member configured to move in one direction and to retract in the opposite direction. For example, the spring 122 may be on a cantilever configured to move in directions 124 (e.g. left and right as oriented). The spring 122 may move in either direction due to accelerations experienced by the Hall sensor. The spring 122 may have a restoring force that brings the Hall sensor back to a neutral or initial position, which may be directly between the minimal width ends of the two ends 120A, 120B within the gap 129.

The spring 122 may be restrained to move in only the directions 124 as indicated, which may be in horizontal directions as oriented in the figures. A rod 134 or other extended structure may extend through the spring 122 to constrain movement of the spring 122 and Hall sensor 130 in the one dimension. The Hall sensor 130 may therefore move only left and right (as oriented) from its position as shown. The Hall sensor 130 may move in response to experiencing acceleration, such as an acceleration caused by the moving vehicle or machinery, for example a cryogenic rocket launch or flight.

A power supply 132 may provide a voltage or a current to the Hall sensor 130. The power supply 132 may be attached to the body 112 a shown. In some embodiments, the power supply 132 may be located remotely from the Hall sensor 130, such as fifty feet or more away from the Hall sensor 130. The Hall sensor 130 may be electrically connected to the power supply 132 via electrical leads, which may extend through the rod 134. In some embodiments, an "X" VDC power supply 132 is electrically connected to the Hall sensor 130, where "X" is a generic variable designating any numeric value, and a sensitivity of the accelerometer 100 is at least X V/g. In some embodiments, the power supply 132 is a 5 VDC power supply and the rounded magnetic assembly 120 may facilitate sensitivities in the 5 V/g range from DC to 20 Khz (which may only be limited by mechanical structure, not Hall Sensor) and affordably in cryogenic rocket turbomachinery applications.

The non-linear magnetic field produced in and/or near the gap 129 by the rounded magnetic assembly 120 may include magnetic field lines that extend in a vertical or approximately vertical direction as oriented in the figure. The non-linear field lines may extend perpendicularly or approximately perpendicularly to the directions 124. Thus movement of the Hall sensor 130 may be perpendicular to the non-linear flux, resulting in large changes in electrical output in response to small displacements of the Hall sensor 130 relative to the magnetic assembly 120. In some embodiments, the magnetic assembly 120 produces a very steep field gradient seen by the Hall sensor 130 and measures acceleration perpendicular to the highly concentrated flux. Due to the discontinuously steep field gradient, a very small displacement between the Hall sensor 130 and the magnetic assembly 120 perpendicular to the flux will produce a very large change in the Hall voltage. In some embodiments, the design shown may be used for a practical cryogenic accelerometer package requiring no internal electronics to produce a 5 volts per gravitational acceleration unit (V/g) sensitivity level. In some embodiments, the sensitivity may be greater than 3 V/g, greater than 3.5 V/g, greater than 4 V/g, greater than 4.5 V/g, or greater than 5 V/g.

In some embodiments, the rounded magnetic assembly 120 creates a highly-concentrated 1000 Oersted (Oe) in the gap 129 between cone-shaped ends 120A, 120B of the rounded flux concentrator 123, which further concentrate the flux lines 121 coming from the magnets 126, 128 in the concentrator 123. The Hall sensor 130 may have inertial mass on the end of the spring 122, which may be anchored to the accelerometer body 112 or housing and constrained to move in only one direction as described. When the accelerometer 100 sees acceleration, the inertial mass of the Hall sensor 130 may compress or extend the coil spring 122 and thus move the Hall sensor 130 perpendicular to the flux lines at the gap 129. Due to the highly concentrated flux and the fact that the Hall sensor 130 is moving perpendicular to the flux lines, the Hall sensor 130 may go from seeing greater than 1000 Oe to seeing zero Oe within just a few thousandths of an inch. This may translate into sensitivities in the range of 5 V/g or greater as described.

Figure 2C:
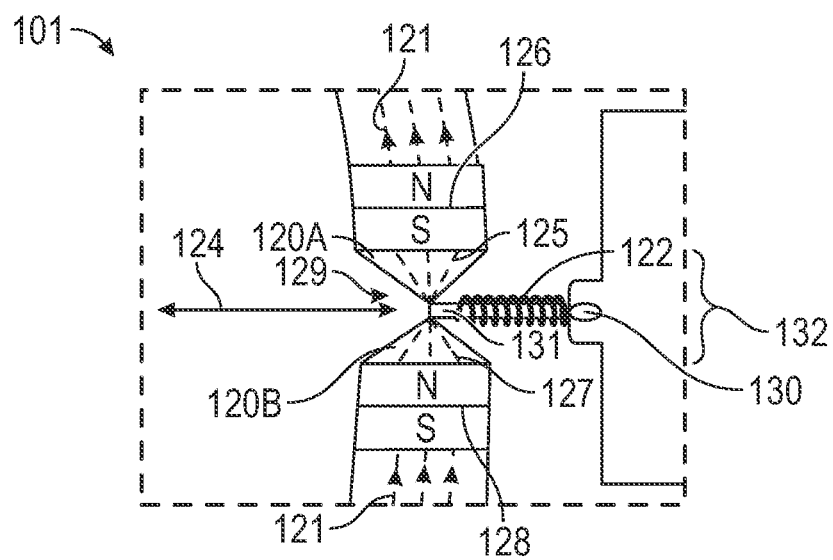
FIG. 2C is a close-up view of another embodiment of a unipolar Hall-based accelerometer having a Hall sensor, a rounded magnetic assembly, and a permeable bridge.

As shown in FIG. 2C, in some embodiments, a Hall-based accelerometer 101 may include a stationary Hall sensor 130 and stationary magnetic assembly 120 with a moveably supported permeable bridge 131. FIG. 2C shows a detailed view of the accelerometer 101 at the gap 129. The accelerometer 101 may include the same features and functions as the accelerometer 100 of FIGS. 2A and 2B, except as otherwise described. The accelerometer may thus include the magnetic assembly 120, the elongate, rounded concentrator 123, the body 112, etc.

As shown in FIG. 2C, the accelerometer 101 may hold both the magnetic assembly 120 and the Hall sensor 130 stationary and bridge the two magnetically with a movable permeable bridge 131, which may be a flux concentrator. The permeable bridge 131 may be made of ferromagnetic material. The permeable bridge 131 may move perpendicular to the magnetic flux lines 125, 127 coming from the C-magnet. The position of the permeable bridge 131 will vary the magnetic flux detected by the Hall sensor 130. The movement of the permeable bridge 131 may be controlled, e.g. resisted, by the coil spring 122. Accordingly, the position of the permeable bridge 131 and the corresponding value of magnetic flux will be representative of the acceleration experienced by the accelerometer 101.

The permeable bridge 131 may concentrate the flux in a particular location. Other flux concentrators may concentrate flux wherever it is (i.e. in any location). Thus, the permeable bridge 131 may be similar to a flux concentrator but with the difference that the permeable bridge 131 concentrates the flux in a particular location between two other relevant locations or features, thus concentrating the flux in an area that "bridges" two other features magnetically. The permeable bridge 131 may not be inherently different than the conical concentrators at the ends of the C-magnet, although on a case-by-case basis, the permeable bridge 131 may or may not be a different shape or material than the conical concentrators and in this embodiment, the permeable bridge 131 is movable as an inertial mass sprung to respond to acceleration where the conical concentrators are stationary. In other embodiments, one or both conical concentrators at the first and second ends 120A, 120B could be permeable bridges as inertial masses sprung to respond to accelerations.

In some embodiments, the accelerometer 101 may include an additional flux concentrator located adjacent, e.g. on the backside or other locations, to the hall sensor 130. For example, there could be another C-shaped yoke or rounded flux concentrator 123 on the adjacent the stationary Hall sensor 130, which arrangement may be similar to the corresponding aspect of the system shown in and described with respect to FIG. 3A.

The accelerometer 101 with moveable permeable bridge 131 provides several advantages. For example, the permeable bridge 131 may be a simple piece of metal with no wires attached, which may be less complex as compared to moving a suspended Hall sensor 130. The permeable bridge 131 may be much smaller and lighter than the C-magnet, and so springing the permeable bridge 131 may be more practical than springing the magnetic assembly 120. As further example, in some embodiments, the accelerometer 101 may have a specific (movable) inertial mass for a given application. The inertial mass may be attached to or integral with the permeable bridge 131. The inertial mass may have vibrational characteristics (such as resonant frequencies, etc.) that are inconsistent with that of the magnet mass or the wired Hall Sensor 130. In such cases, the permeable bridge 131 may be better suited for attachment to the specific inertial mass without perturbing the specific mass or attaching wires to it. Further, one advantage of holding the Hall sensor 130 and the magnetic assembly 120 stationary and using a moveable permeable bridge 131 is that the moveable mass can be chosen to be most advantageous for its impact on the vibrational characteristics without having to be constrained by other considerations that are necessary for a magnet array or an electrically-excited Hall sensor with wires connected to it. The moveable mass approach described herein, with the stationary Hall sensor 130 and the magnetic assembly 120, provides more latitude to choose the mass, shape, etc. of the moveable mass based more on the vibrational characteristics and less on the magnetic characteristics and/or any wires that need to be attached. Further, such embodiments may provide advantages, for example over piezoelectric accelerometers, due to the sensing element not being part of the vibrating resonant structure (i.e. the Hall sensor is a stationary observer, where in some piezoelectric accelerometers, the piezoelectric crystal may be both the sensing element and a structural component affecting the vibrating structure.)

The embodiments of the Hall-based accelerometers 100 and 101 may include features that are included in other embodiments of Hall-based accelerometers described herein, such as those of FIGS. 3A-6, and vice versa, except as otherwise described. For example, the permeable bridge 131 may be stationary while the magnetic assembly 120 is moveable, there may be an additional magnetic assembly 120, there may be an additional magnet located adjacent the gap 129, etc. Details of these and other features that may be incorporated into the accelerometers 100 or 101 are further described herein.

III. Bi-Polar Embodiments

Figure 3A:
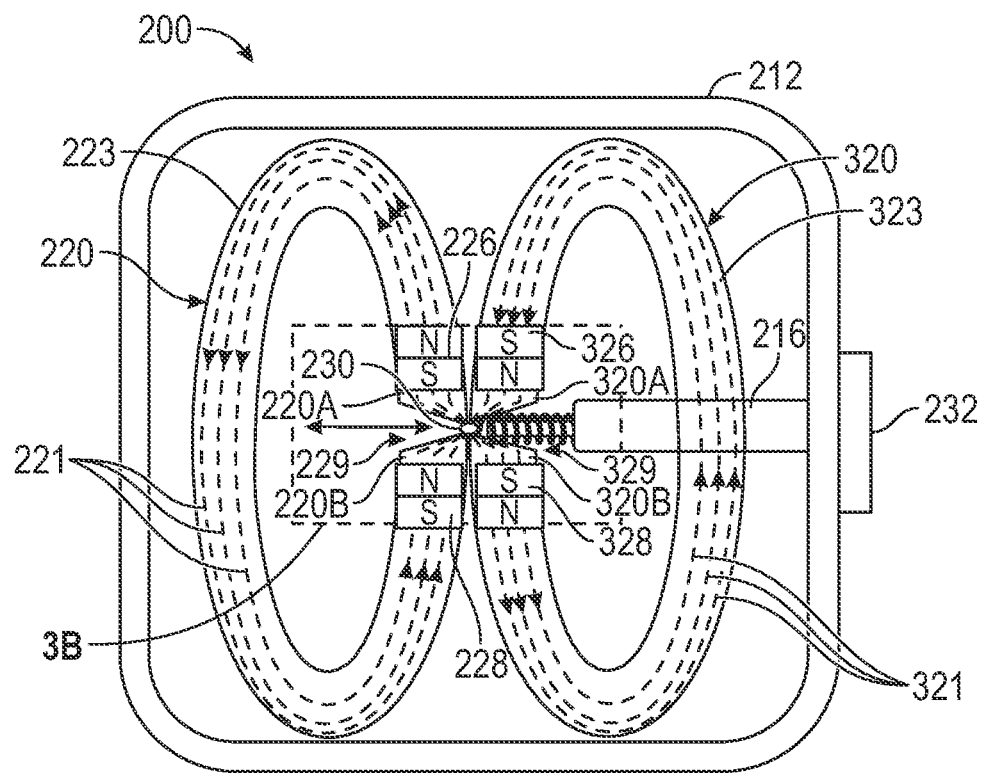
FIGS. 3A and 3B are schematic and closeup views, respectively, of an embodiment of a bipolar Hall-based accelerometer having a Hall sensor and two rounded magnetic assemblies with opposite magnetization producing non-linear fluxes.
Figure 3B:
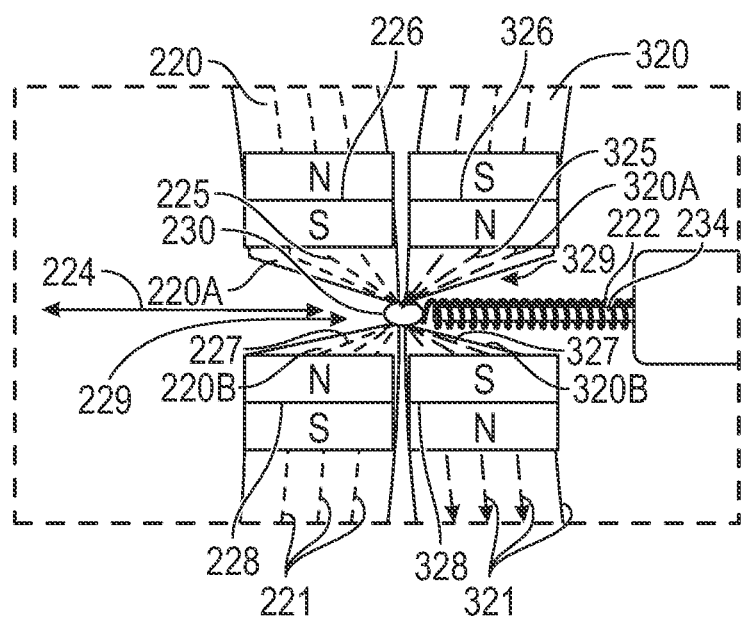

FIGS. 3A and 3B are schematic and closeup views, respectively, of an embodiment of a bipolar Hall-based accelerometer 200 having the Hall sensor 230 and two rounded magnetic assemblies 220, 320 with opposite magnetization producing non-linear fluxes in the gaps 229, 329. A bi-polar flux gradient (for example, see FIG. 4B, which is notional only and may be not perfectly representative of the systems of FIGS. 3A and 3B) may be produced in the gaps 229, 329, instead of a unipolar flux gradient (for example, see FIG. 4A, which is notional only and may not be perfectly representative of the systems of FIGS. 2A and 2B) as in some embodiments of the accelerometer 100 of FIGS. 2A and 2B. A bi-polar gradient may reduce the amount of electronic circuitry required to determine whether the acceleration is in the positive or negative direction along the axis perpendicular to the magnetic fields.

The accelerometer 200 may include a body 212, which may have the same or similar features as the body 12 or 112. The accelerometer 200 may include a Hall sensor 230, spring 222, rod 234, and power supply 232, which may have the same or similar features as, respectively, the Hall sensor 130, spring 122, rod 134, and power supply 132 of the accelerometer 100 of FIGS. 2A and 2B.

The first magnetic assembly 220 may have the same or similar features as the magnetic assembly 100. Thus, the first magnetic assembly 220 may include a rounded flux concentrator 223, first and second ends 220A, 220B, first and second magnets 226, 228, and magnetic flux lines 221, which may have the same or similar features as, respectively, the rounded flux concentrator 123, first and second ends 120A, 120B, first and second magnets 126, 128, and magnetic flux lines 121 of the accelerometer 100 of FIGS. 2A and 2B. The first and second magnets 226, 228 each have north "N" and south "S" poles oriented similar to the magnetic assembly 100, such that the direction of the magnetic flux lines within the rounded concentrator is counterclockwise as shown and extends vertically upward at the gap 129 as oriented.

Further, the second ends 220A, 22B may each have reduced widths and be pointed or biased to one side instead of centrally located, as shown pointed to the right (as oriented) toward the second gap 329 of the second magnetic assembly 320. The first magnetic assembly may therefore produce concentrated magnetic lines 225, 227 from the first and second magnets 226, 228 respectively that produce vertical or approximately vertical (as oriented) non-linear flux in the gap 229. Thus the concentrated non-linear flux in the gap 229 may be biased toward the second magnetic assembly 320 such that the Hall sensor 230, located at least partially within the gap 229, at least partially experiences the non-linear gradient produced by the first magnetic assembly 220. Furthermore, in some embodiments, interactions between the magnets 226 and 326 and/or between the magnets 228 and 328 may be managed or tuned in a balanced manner for further advantage. For example, in a bipolar field, the vertical flux lines, e.g. in the gap between vertically-separated first and second ends 220A, 220B, may be more prevalent than horizontal flux lines, for example between horizontally-separated second ends 220B, 320B, by positioning the second end 220B closer to the first end 220A and/or positioning the second end 220B farther from the second end 320B. Thus the relative vertical and horizontal distances between the various ends may be configured to achieve various relative strengths or prevalence among the various field lines.

The second magnetic assembly 320 may be located adjacent to the first magnetic assembly 220 within the body 212. The second magnetic assembly 320 may have the same or similar features as the first magnetic assembly 220, but with opposite magnetic polarization. Thus, the second magnetic assembly 320 may include a rounded flux concentrator 323, first and second ends 320A, 320B, third and fourth magnets 326, 328, and magnetic flux lines 321, which may have the same or similar features as, respectively, the rounded flux concentrator 223, first and second ends 220A, 220B, first and second magnets 226, 228, and magnetic flux lines 221 of the first magnetic assembly 220, except as described otherwise.

Further, the second ends 320A, 320B may each have reduced widths and be biased or pointed to one side instead of centrally located, as shown pointed to the left (as oriented) toward the first gap 229 of the first magnetic assembly 220. The second magnetic assembly 320 may therefore produce concentrated magnetic lines 325, 327 from the third and fourth magnets 326, 328 respectively that produce vertical or approximately vertical (as oriented) non-linear flux in the gap 329. Thus the concentrated non-linear flux in the gap 329 may be biased toward the first magnetic assembly 220, such that the Hall sensor 230 located at least partially within the gap 329 at least partially experiences the non-linear gradient produced by the second magnetic assembly 320. Furthermore, in some embodiments, the interactions between the magnets 226 and 326 and magnets 228 and 328 may be managed or tuned for further advantage.

However, the third and fourth magnets 326, 328 may be flipped relative to the first and second magnets 226, 228, such that the direction of the magnetic flux lines 321 are also counterclockwise and thus the magnetic flux at the gap 329 is vertically downward as oriented. The directions of the flux at the gaps 229 and 329 are therefore in opposite directions, creating a bipolar, non-linear gradient of flux as the Hall sensor 230 moves in the two directions 224 from its neutral or initial position. The Hall sensor 230 may initially be at least partially within, or in between, the concentrated fluxes at the gaps 229, 329 produced by the two magnetic assemblies 220, 320. As the Hall sensor 230 moves from the initial position in one of the directions 224 (e.g. to the left as oriented) farther along the gap 229 or 329, it may experience a positive or negative change in magnetic field strength, and as the Hall sensor 230 moves from the initial position in the opposite of the two directions 224 (e.g. to the right as oriented) farther along the other of the gap 229 or 329, it may experience a negative or positive change, respectively, in magnetic field strength. An example data plot (which is notional only, and not perfectly representative of the system of FIG. 3A) for a bipolar non-linear gradient is shown in FIG. 4B. Furthermore, the interactions between the magnets 226 and 326 and magnets 228 and 328 may be managed or tuned for further advantage, as described.

As shown, the Hall sensor 230 may be moveably supported, with the two magnetic assemblies 220, 320 stationary. In some embodiments, the Hall sensor 230 may be stationary, and the two magnetic assemblies 220, 320 may be moveably supported, for example by one or more springs. The two magnetic assemblies 220, 320 may move as a unit. For example, the two magnetic assemblies 220, 320 may be rigidly connected together so they move the same amount in response to a similar acceleration. The two magnetic assemblies 220, 320 may be configured to move in the directions 224.

IV. Bi-Polar and Unipolar Field Gradients

FIGS. 4A and 4B are data plots 400, 410 showing example non-linear relationships of displacement versus change in magnetic flux for, respectively, unipolar and bipolar Hall-based accelerometers according to some embodiments. The data plots show magnetic field strength on the vertical or Y-axis in Oersted (Oe) and displacement on the horizontal or X-axis in inches (in). Any of the embodiments described herein or variations thereof may produce the results shown. Further, the particular numbers are merely examples, and the results may be scaled for different embodiments.

As shown in FIG. 4A, for data plot 400, a unipolar non-linear gradient may be produced, for example by the accelerometer 100 of FIGS. 2A and 2B. The initial position may be at 0 in. As the Hall sensor and magnetic field are displaced relative to each other in either the positive or negative directions, the field strength may have a first rate of decrease in strength within first regions 402, 404 of the data plot 400. The first region 402 may correspond to a negative displacement, and the first region 404 may correspond to a positive displacement, relative to the initial position. The field strength may decrease within the first regions 402, 404 from about 1000 Oe to about 200 Oe in just a few thousandths of an inch. In some embodiments, the field may decrease in strength, from about 1000 Oe to about 200 Oe, or decrease 80% or about 80%, or decrease greater than 50%, greater than 60%, greater than 70%, or greater than 75%, for displacements of no more than 0.008 in, no more than 0.007 in, no more than 0.006 in, no more than 0.005 in, no more than 0.004 inches, no more than 0.003 in, or no more than 0.002 in. The various values may occur within the initial regions 402, 404 of change in the field. The change in field versus displacement within the initial regions 402, 404 may be linear, or it may be non-linear, for example parabolic, exponential, etc.

The field for data plot 400 may include second regions 406, 408 of change having a different rate of change relative to the initial regions' 402, 404 rate of change. As the Hall sensor and magnetic field are displaced relative to each other in either the positive or negative directions from the initial region 402 into the second region 406 or 408, the field strength may further decrease in strength, from about 200 Oe to about 0 (zero) Oe in about in. In some embodiments, the field may decrease in strength, from about 200 Oe to about 0 (zero) Oe, or decrease 100% or about 100%, or decrease greater than 80%, greater than 85%, greater than 90%, or greater than 95%, for positive or negative displacements of no more than 0.050 in, no more than 0.060 in, no more than 0.070 in, no more than 0.080 in, no more than 0.090 inches, or no more than 0.100 in. The change in field versus displacement within the second regions 406, 408 may be linear, or it may be non-linear, for example parabolic, exponential, etc.

As shown in FIG. 4B, the data plot 410 shows a bipolar non-linear gradient may be produced, for example by the accelerometer 200 of FIGS. 3A and 3B. The initial position may be at 0 in. As the Hall sensor and magnetic field are displaced relative to each other in the positive or negative directions, the field strength may increase or decrease in strength, respectively. In some embodiments, as the Hall sensor and magnetic field are displaced relative to each other in the positive or negative directions, the field strength may decrease or increase, respectively, for example where the polarities of the two magnetic assemblies are each reversed.

As shown, in this embodiment, in data plot 410 in an initial region 412 for displacements in the positive direction, the field strength may increase from about 0 Oe to about 800 Oe in just a few thousandths of an inch. In some embodiments, the field strength may increase in strength, from about 0 Oe to about 800 Oe, or increase 800% or about 800%, or increase greater than 500%, greater than 600%, greater than 700%, or greater than 750%, for displacements of no more than 0.008 in, no more than 0.007 in, no more than 0.006 in, no more than 0.005 in, no more than 0.004 inches, no more than 0.003 in, or no more than 0.002 in. The various values may occur within the initial region 412 of change in the field. The change in field versus displacement within the initial region 412 may be linear, or it may be non-linear, for example parabolic, exponential, etc.

The field for data plot 410 may include a second region 414 of change having a different rate of change relative to the initial region 412 of change. As the Hall sensor and magnetic field are farther displaced relative to each other in the direction from the initial region and into the second region 414, the field may further increase in strength, from about 800 Oe to about 1000 Oe in about 0.100 in. In some embodiments, the field may increase in strength, from about 800 Oe to about 1000 Oe, or increase 20% or about 20%, or increase greater than 5%, greater than 10%, greater than 15%, or greater than 20%, for farther positive displacements of no more than 0.050 in, no more than 0.060 in, no more than 0.070 in, no more than 0.080 in, no more than 0.090 inches, or no more than 0.100 in. The change in field versus displacement within this second region 414 may be linear, or it may be non-linear, for example parabolic, exponential, etc.

In the plot 410, for relative displacements in the negative direction, the same features and results described above may apply but with an opposite change in field strength. An initial region 416 and second region 418 may be similar to the initial region 412 and second region 414 respectively, but with negative changes in field strength. Thus, the absolute magnitude of the change in field strength in the regions 416, 418 may be the same as the regions 412, 414 respectively, but in the negative direction. For example, in the initial region 416 the field strength may decrease from about 0 Oe to about −800 Oe in just a few negative thousandths of an inch of relative negative displacement, and farther decrease from about −800 Oe to about −1000 Oe in about an additional −0.100 in of displacement in the second region 418, etc.

The positive or negative change in magnetic field strength for positive or negative relative displacements, respectively, may be used to determine the direction of experienced acceleration. For example, a positive change in magnetic field strength may indicate an acceleration in a first direction, and a negative change in field strength may indicate an acceleration in a second direction that is opposite the first direction.

V. Multi-Sensitivity Embodiments

Figure 5A:
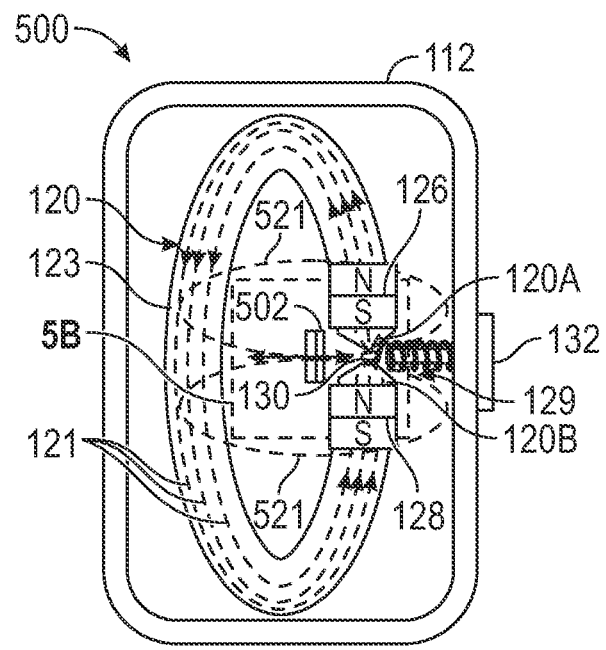
FIGS. 5A and 5B are schematic and closeup views, respectively, of an embodiment of a multi-sensitivity Hall-based accelerometer having a Hall sensor, a rounded magnetic assembly producing non-linear flux, and an adjacent magnet.
Figure 5B:
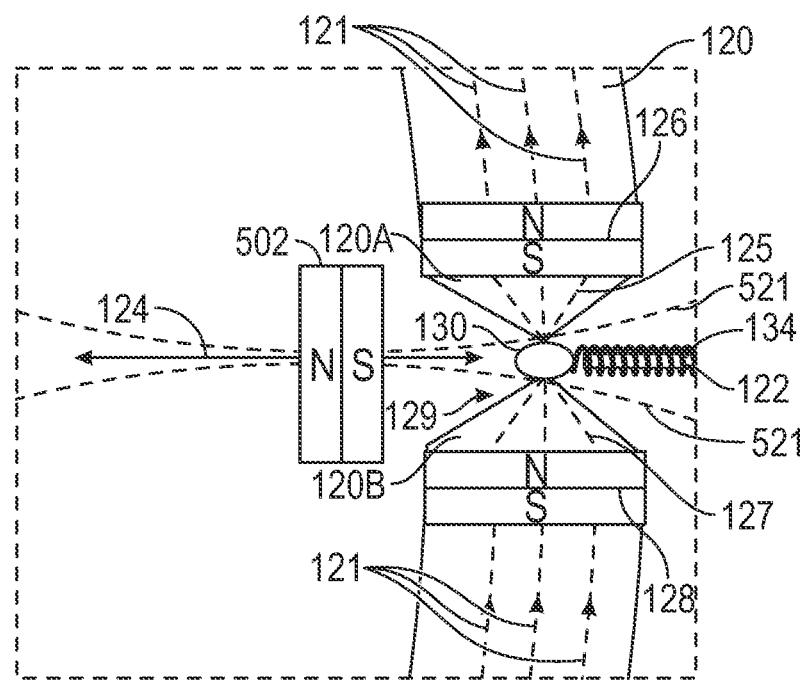

FIGS. 5A and 5B are schematic and partial closeup views, respectively, of an embodiment of a multi-sensitivity Hall-based accelerometer 500 having the Hall sensor 130, the rounded magnetic assembly 120 producing non-linear flux, and an additional magnet 502. The magnetic assembly 120 may be the same as described with respect to FIGS. 2A and 2B.

The accelerometer 500 may further include the magnet 502. The magnet 502 may be the same or similar type of magnet as the magnets 126 or 128 described herein. However, the magnet 502 may be located adjacent the gap 129. The magnet 502 may be located outside the concentrator 120. The magnet 502 may not have a concentrator. The magnet 502 may produce magnetic lines 521. The magnetic lines 521 may extend perpendicularly to the concentrated flux within the gap 129 produced by the rounded magnetic assembly 120. There may be a single additional magnet 502, as shown. In some embodiments, there may be two, three, four, five or more of the additional magnets 502.

The magnet 502 may be located adjacent the Hall sensor 130. The Hall sensor 130 may experience the magnetic flux produced by the magnet 502. The flux may be linear, such that field strength and displacement are related by a single equation to the first order. The magnet 502 may be a low-gradient magnet to add a low sensitivity measurement to the thigh sensitivity capability of the rounded magnetic assembly 120. For example, the rounded magnetic assembly 120 may provide a 5 V/g sensitivity for movements within the concentrated non-linear flux at low vibrational levels and the magnet 502 may provide a 1 milli-volt/g (mV/g) sensitivity at high vibrational levels. This accelerometer 500 may thus provide a single cryogenic rocket engine accelerometer that functions from DC to 20 KHz (limited by mechanical structure, not Hall Sensor) eliminating the need for a second over-range accelerometer.

The additional magnet 502 may produce only a very shallow gradient seen by the Hall Sensor 130. Accordingly, the second magnet 502 may produce vibration sensitivities in the range of 1 mV/G. Through strategic placement of the second magnet 502 generating a shallow gradient, a single Hall-Sensor accelerometer will thus give up to 5 V/g at small amplitudes and 1 mV/g or 10 mV/g at large amplitudes essentially simultaneously and in a way that can be reliably interpreted by signal processing (e.g. 0 to 4 volts spans 1 g, and 4.001 to 5 volts spans 1000 g's). This may allow high fidelity low-g measurements and three-orders-of-magnitude overrange capacity simultaneously in a single accelerometer. In some embodiments, a first sensitivity as the Hall sensor moves relative to a first non-linear magnetic field is X V/g, and a second sensitivity as the Hall sensor moves relative to a portion of a second magnetic field located outside the first magnetic field is at least X/5,000 V/g or at least X/500 V/g.

After the Hall sensor 130 has moved perpendicular to the very steep non-linear gradient lines 125, 127 of the magnetic assembly 100, and is no longer seeing any flux from the magnetic assembly 100, the Hall sensor sees the shallow gradient lines 521 generated by the additional magnet. Where the motion perpendicular to the very steep gradient may produce 5 V/g, the motion parallel to the shallow gradient from the second magnet may produce only 5 mV/g or 10 mV/g. Accordingly, a single accelerometer can be used for high-fidelity low-g measurements and significant over-range measurements simultaneously.

As with the other embodiments described herein, various modifications may be made, such as different directions of motion, cantilever springs instead of coil springs, springing the magnetic assembly 100 and magnet 502 instead of the Hall sensor 130, springing a third component such as a permeable bridge with both the rounded magnetic assembly 100 and the sensor 130 stationary, etc. For example, the Hall sensor 130 may be stationary, and the magnetic assembly 100 and the magnet 502 may move together as a unit relative to the Hall sensor 130. In some embodiments, various strategic orientations of the shallow gradient magnet(s) 502 may be implemented, for example to optimize items such as but not limited to compromising some of the low-g resolution to increase the higher-g resolution, and more than two sensitivities from a single accelerometer.

VI. Sensor Embodiments

Figure 6:
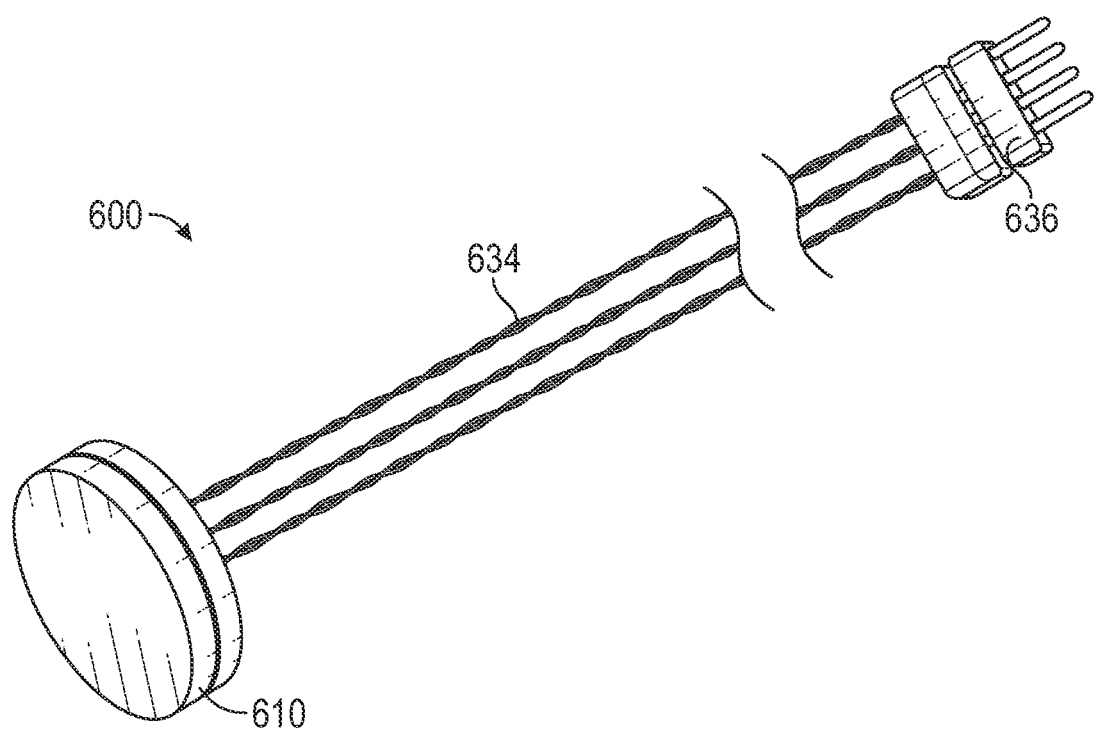
FIG. 6 is a perspective view of an embodiment of a Hall sensor that may be used with any of the Hall-based accelerometers herein.

FIG. 6 is a perspective view of an embodiment of a Hall sensor 600 that may be used with any of the Hall-based accelerometers herein, such as the accelerometer 100, 200 or 500. The Hall sensor 600 may accurately measure magnetic fields in cryogen a thousand times more sensitively than what is required for speed sensing. In some embodiments, the Hall sensor 600 may be a 2Dex™ Plug-and-Play sensor from Lake Shore Cryotronics (Westerville, OH).

The Hall sensor 600 may include a sensing element 610, electrical leads 634, and a connector 636. The sensing element 610 may be placed in a magnetic field and be connected to the connector via the electrical leads 634. The voltage of the sensing element 610 may change in response to changes in the magnetic field. Such voltage may be communicated via the electrical leads 634 and connector 636 to a display or controller for determining and/or analyzing accelerations. The sensing element 610 may be a disc shape, such as with the axial arrangement of sensor as shown. The sensing element 610 may be about 3.5 mm in diameter. In some embodiments, the Hall sensor 600 may be an axial insert arrangement such as a cylindrical shape, a transverse arrangement such as a planar shape, or a 3-axis arrangement such as a rectangular box shape. The Hall Sensor 600 may have a constant current supplied and voltage monitored. Several different types of materials may be used for the sensing element 610. Although the ability to measure DC acceleration is an advantage to Hall-based sensors vs. traditional piezoelectric crystals, AC coupling may be employed if desired.

While the above detailed description has shown, described, and pointed out novel features of the present disclosure as applied to various embodiments, it will be understood that various omissions, substitutions, and changes in the form and details of the device or process illustrated may be made by those skilled in the art without departing from the spirit of the present disclosure. As will be recognized, the present disclosure may be embodied within a form that does not provide all of the features and benefits set forth herein, as some features may be used or practiced separately from others. All changes which come within the meaning and range of equivalency of the claims are to be embraced within their scope.

The term "comprising" as used herein is synonymous with "including," "containing," or "characterized by," and is inclusive or open-ended and does not exclude additional, unrecited elements or method steps. With respect to the use of substantially any plural and/or singular terms herein, those having skill in the art may translate from the plural to the singular and/or from the singular to the plural as is appropriate to the context and/or application. The various singular/plural permutations may be expressly set forth herein for sake of clarity.

It will be understood by those within the art that, in general, terms used herein are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should be construed in light of the number of significant digits and ordinary rounding approaches. For example, terms such as about, approximately, substantially, and the like may represent a percentage relative deviation, in various embodiments, of ±1%, ±5%, ±10%, or ±20%.

The above description discloses several methods and materials of the present disclosure. The present disclosure is susceptible to modifications in the methods and materials, as well as alterations in the fabrication methods and equipment. Such modifications will become apparent to those skilled in the art from a consideration of this disclosure. Consequently, it is not intended that the present disclosure be limited to the specific embodiments disclosed herein, but that it covers all modifications and alternatives coming within the true scope and spirit of the present disclosure.

What is claimed is:

1. An accelerometer comprising:
   a rounded first magnetic assembly comprising a first concentrator extending from a first end having a first magnet to an opposing second end having a second magnet and forming a first gap between the first and second ends, the first magnetic assembly having a reduced width at each of the first and second ends and producing a non-linear first magnetic field between the first and second ends; and
   a Hall sensor at least partially located within a first portion of the first magnetic field having first magnetic field lines extending in a first direction, wherein the Hall sensor or first magnetic assembly is configured to move to cause relative displacement of the Hall sensor perpendicular to the first direction.

2. The accelerometer of claim 1 further comprising a spring moveably supporting the Hall sensor, and wherein the first magnetic assembly is stationary, such that the Hall sensor is configured to move relative to the stationary first magnetic assembly.

3. The accelerometer of claim 1 further comprising a spring moveably supporting the first magnetic assembly, and wherein the Hall sensor is stationary, such that the first magnetic assembly is configured to move relative to the stationary Hall sensor.

4. The accelerometer of claim 1, wherein the first and second ends of the first magnetic assembly are cone-shaped.

5. The accelerometer of claim 1, wherein the first concentrator is C-shaped.

6. The accelerometer of claim 1, wherein the first concentrator extends along an annular direction, the first magnetic field lines within the first portion of the first magnetic field extend in the annular direction in the first gap, and the Hall sensor is moveably supported and configured to move in a direction perpendicular to the annular direction in the first gap.

7. The accelerometer of claim 1, further comprising an "X" VDC supply electrically connected to the Hall sensor, and wherein a sensitivity of the accelerometer is at least X V/g.

8. The accelerometer of claim 1, wherein the Hall sensor experiences a change in flux of at least 1000 Oersted in response to relative movement between the Hall sensor and the first magnetic assembly of no more than 0.005 inches.

9. The accelerometer of claim 1, wherein an initial position of the Hall sensor is located in the first gap between the first and second ends.

10. The accelerometer of claim 1 further comprising a body encasing the first magnetic assembly and the Hall sensor, the body configured to be attached to a cryogenic rocket.

11. The accelerometer of claim 1 further comprising:
a rounded second magnetic assembly adjacent the first magnetic assembly, the second magnetic assembly comprising a second concentrator extending from a third end having a third magnet to an opposing fourth end having a fourth magnet and forming a second gap between the third and fourth ends, the second gap adjacent to the first gap, the second magnetic assembly having a reduced width at each of the third and fourth ends producing a non-linear second magnetic field between the third and fourth ends, and wherein the second magnetic assembly is oppositely magnetized relative to the first magnetic assembly,
wherein the Hall sensor is at least partially located within a second portion of the second magnetic field having second magnetic field lines extending in a second direction that is opposite the first direction, and
wherein the Hall sensor or second magnetic assembly is configured to move to cause relative displacement of the Hall sensor perpendicular to the second direction.

12. The accelerometer of claim 11, further comprising a spring moveably supporting the Hall sensor, and wherein the first and second magnetic assemblies are stationary, such that the Hall sensor is configured to move relative to the stationary first and second magnetic assemblies.

13. The accelerometer of claim 11, further comprising a spring moveably supporting the first and second magnetic assemblies, and wherein the Hall sensor is stationary, such that the first and second magnets are configured to move as a unit relative to the stationary Hall sensor.

14. The accelerometer of claim 11, where the first, second, third, and fourth ends are cone-shaped.

15. The accelerometer of claim 11, where the first, second, third, and fourth ends point towards each other.

16. The accelerometer of claim 11, wherein the Hall sensor experiences a change in flux of at least 1000 Oersted in response to relative movement between the Hall sensor and the first and second magnetic assemblies of no more than 0.005 inches.

17. The accelerometer of claim 1, further comprising a third magnet located adjacent the first gap and producing a second magnetic field.

18. The accelerometer of claim 17, wherein second magnetic field lines of the second magnetic field extend within the first portion of the first magnetic field in a second direction that is perpendicular to the first direction.

19. The accelerometer of claim 17, wherein the Hall sensor is moveably supported by a spring, and the first magnetic assembly and the second magnet are stationary.

20. The accelerometer of claim 17, further comprising a VDC supply electrically connected to the Hall sensor, and wherein a first sensitivity as the Hall sensor moves relative to the first magnetic field is X V/g, and a second sensitivity as the Hall sensor moves relative to a portion of the second magnetic field located outside the first magnetic field is at least X/500 V/g.

* * * * *